United States Patent
Lee

(10) Patent No.: US 11,037,939 B2
(45) Date of Patent: *Jun. 15, 2021

(54) SEMICONDUCTOR DEVICE AND METHOD OF MANUFACTURING THE SAME

(71) Applicant: SK hynix Inc., Icheon-si Gyeonggi-do (KR)

(72) Inventor: Nam Jae Lee, Cheongju-si Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/038,728

(22) Filed: Sep. 30, 2020

(65) Prior Publication Data

US 2021/0013216 A1    Jan. 14, 2021

Related U.S. Application Data

(63) Continuation of application No. 16/159,360, filed on Oct. 12, 2018, which is a continuation of application
(Continued)

(30) Foreign Application Priority Data

May 2, 2016    (KR) .................. 10-2016-0054202

(51) Int. Cl.
*H01L 27/115* (2017.01)
*H01L 23/528* (2006.01)
(Continued)

(52) U.S. Cl.
CPC .......... *H01L 27/115* (2013.01); *H01L 23/528* (2013.01); *H01L 27/1157* (2013.01);
(Continued)

(58) Field of Classification Search
CPC ......... H01L 27/11582; H01L 27/11526; H01L 27/11551; H01L 27/11573; H01L 27/11578

See application file for complete search history.

(56) References Cited

U.S. PATENT DOCUMENTS 10,134,747 B2    11/2018  Lee
10,825,824 B2 *  11/2020  Lee .................. H01L 27/11575
(Continued)

FOREIGN PATENT DOCUMENTS

CN    102136467 A    7/2011
CN    103247589 A    8/2013
(Continued)

*Primary Examiner* — Seahvosh Nikmanesh
(74) *Attorney, Agent, or Firm* — William Park & Associates Ltd.

(57) ABSTRACT

A semiconductor device may include a first cell structure, a second cell structure, a pad structure, a circuit, and an opening. The pad structure may include a first stepped structure and a second stepped structure located between the first cell structure and the second cell structure. The first stepped structure may include first pads electrically connected to the first and second cell structures and stacked on top of each other, and the second stepped structure may include second pads electrically connected to the first and second cell structures and stacked on top of each other. The circuit may be located under the pad structure. The opening may pass through the pad structure to expose the circuit, and may be located between the first stepped structure and the second stepped structure to insulate the first pads and the second pads from each other.

14 Claims, 20 Drawing Sheets

Related U.S. Application Data

No. 15/268,832, filed on Sep. 19, 2016, now Pat. No. 10,134,747.

(51) Int. Cl.

| | |
|---|---|
| *H01L 27/11548* | (2017.01) |
| *H01L 27/11582* | (2017.01) |
| *H01L 27/11575* | (2017.01) |
| *H01L 27/11524* | (2017.01) |
| *H01L 27/11556* | (2017.01) |
| *H01L 27/1157* | (2017.01) |
| *H01L 27/11551* | (2017.01) |
| *H01L 27/11578* | (2017.01) |
| *H01L 27/11573* | (2017.01) |
| *H01L 27/11526* | (2017.01) |

(52) U.S. Cl.
CPC .. *H01L 27/11524* (2013.01); *H01L 27/11548* (2013.01); *H01L 27/11556* (2013.01); *H01L 27/11575* (2013.01); *H01L 27/11582* (2013.01); *H01L 27/11526* (2013.01); *H01L 27/11551* (2013.01); *H01L 27/11573* (2013.01); *H01L 27/11578* (2013.01)

(56) References Cited

U.S. PATENT DOCUMENTS

| | | | |
|---|---|---|---|
| 2014/0054787 | A1 | 2/2014 | Eun et al. |
| 2015/0228623 | A1 | 8/2015 | Oh et al. |

FOREIGN PATENT DOCUMENTS

| | | |
|---|---|---|
| KR | 1020130072522 A | 7/2013 |
| KR | 1020150095397 A | 8/2015 |

* cited by examiner

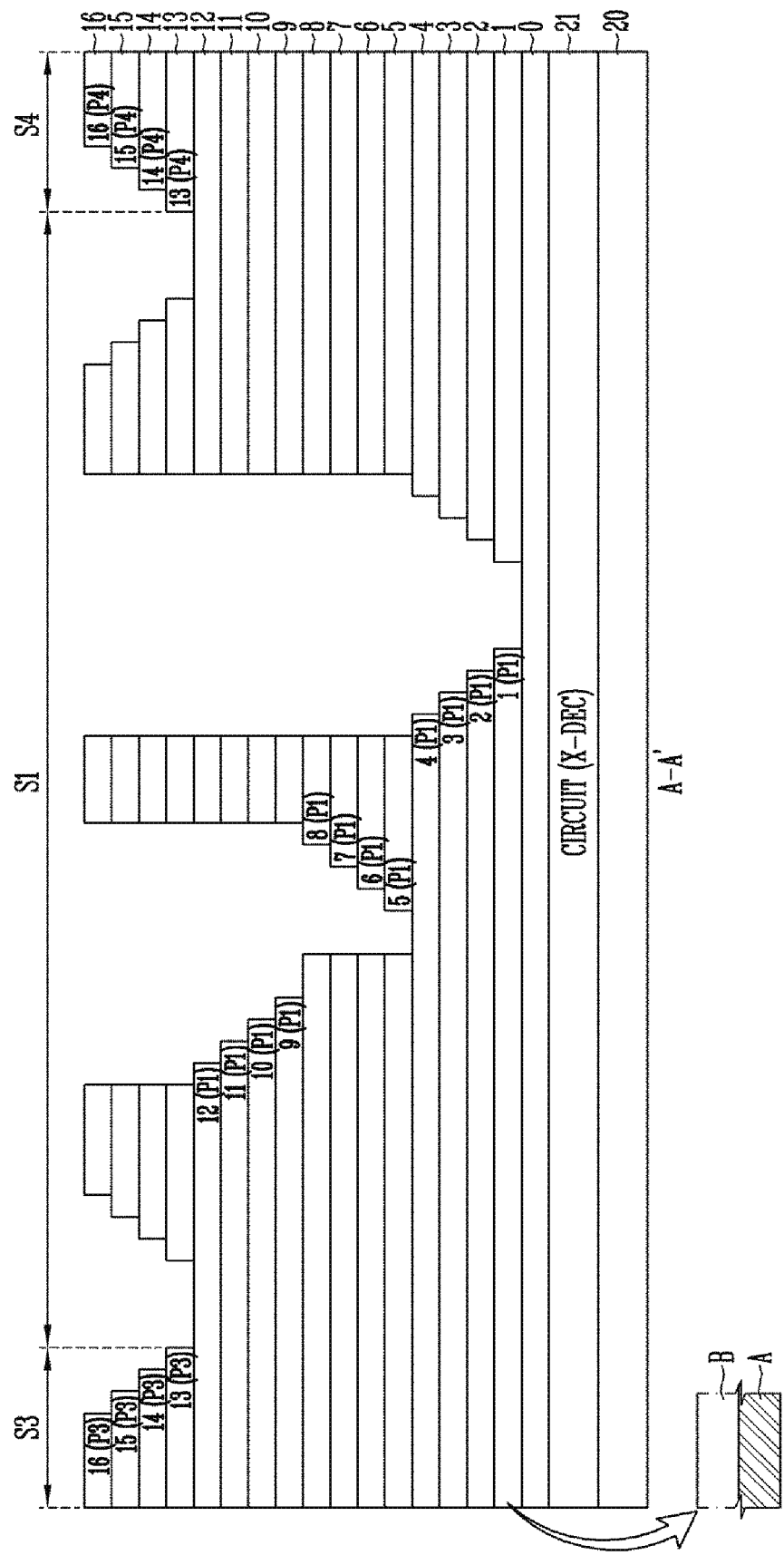

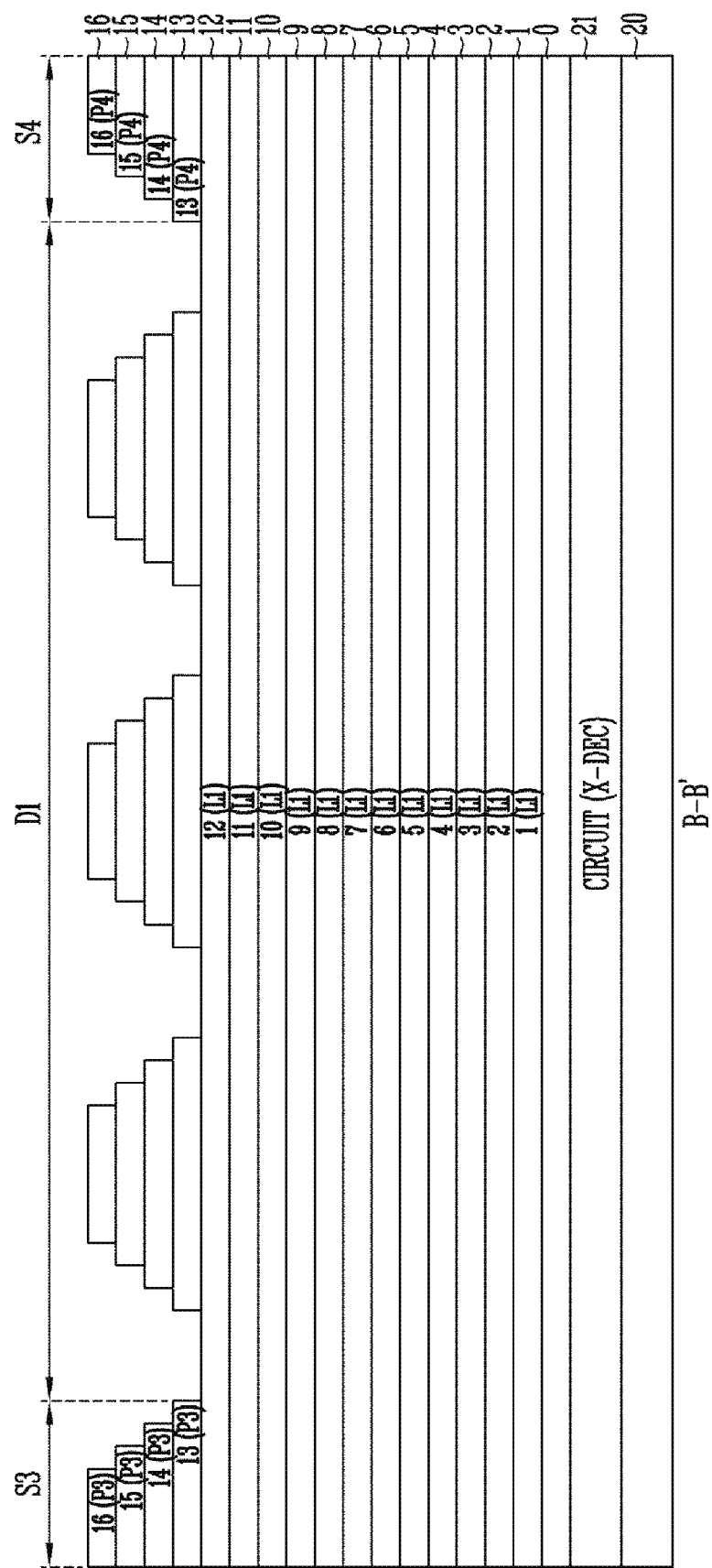

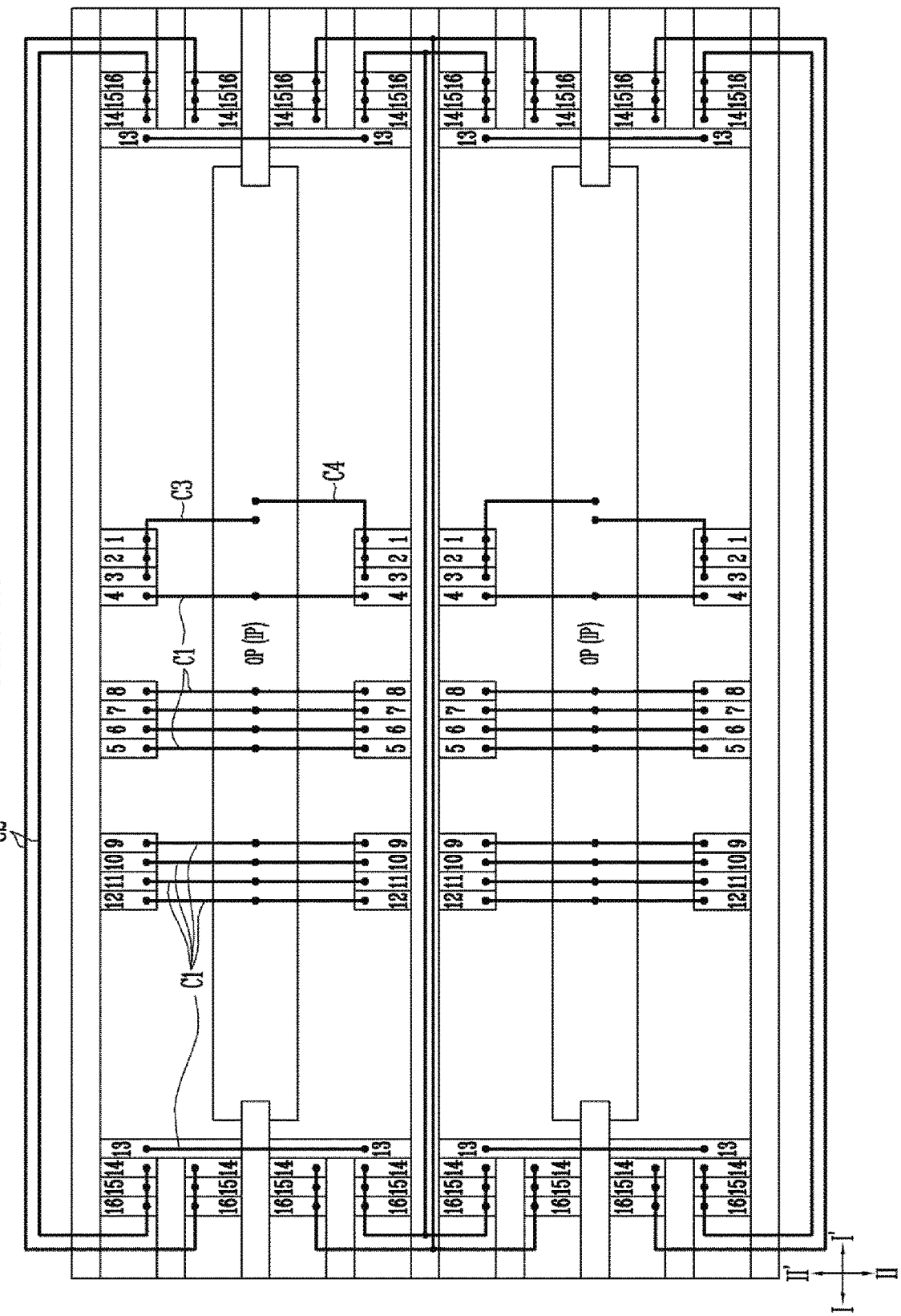

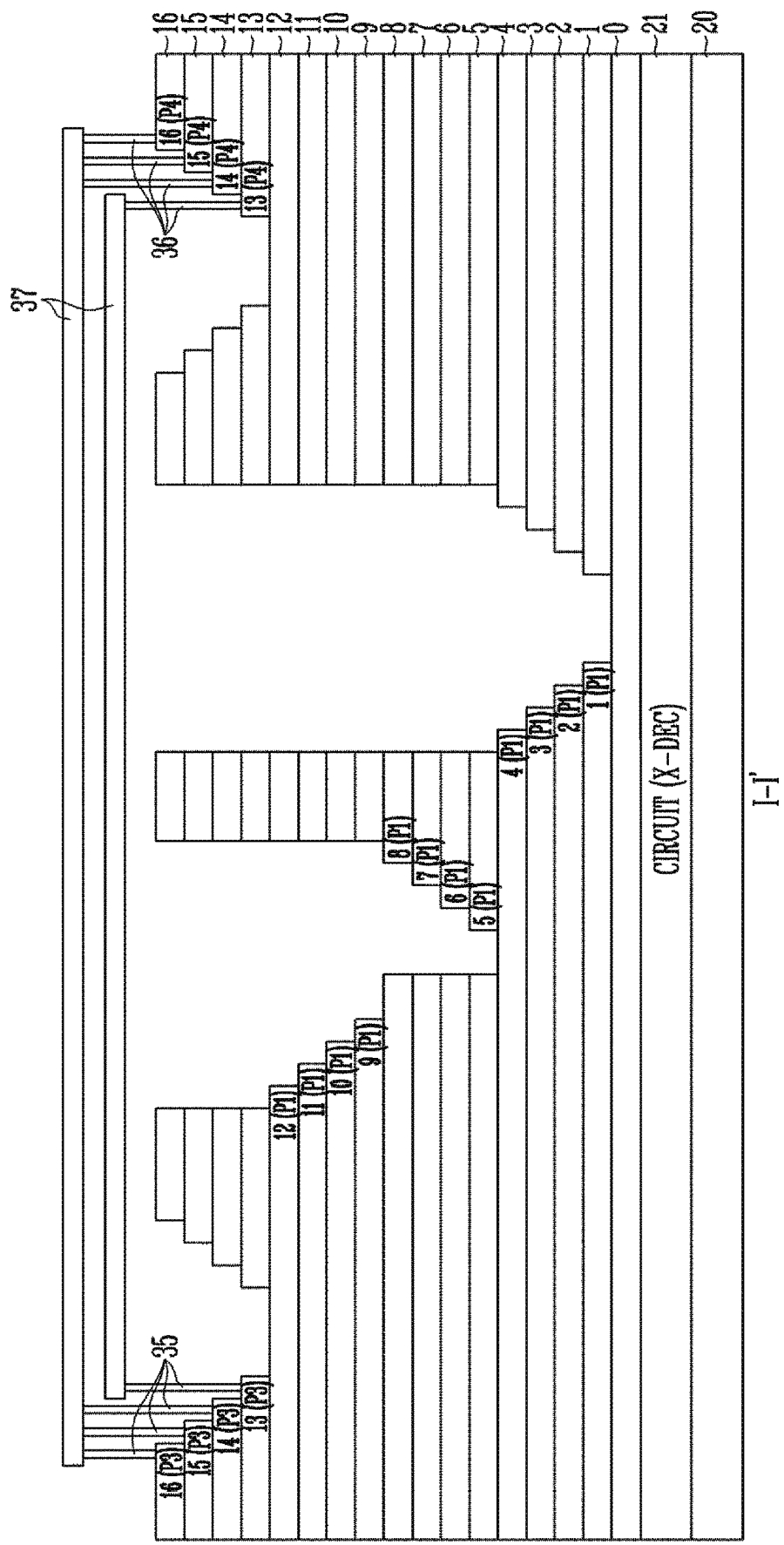

II-II'

II-II'

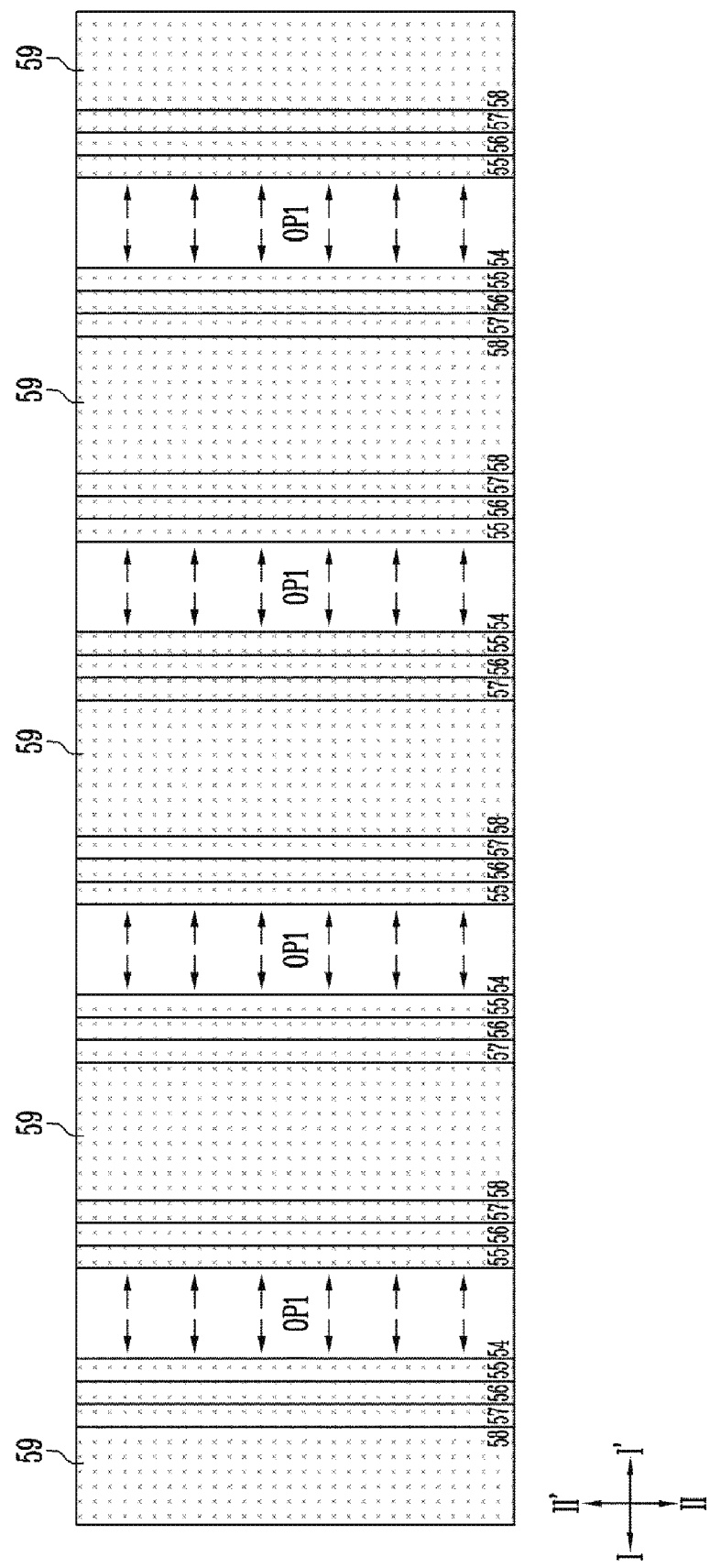

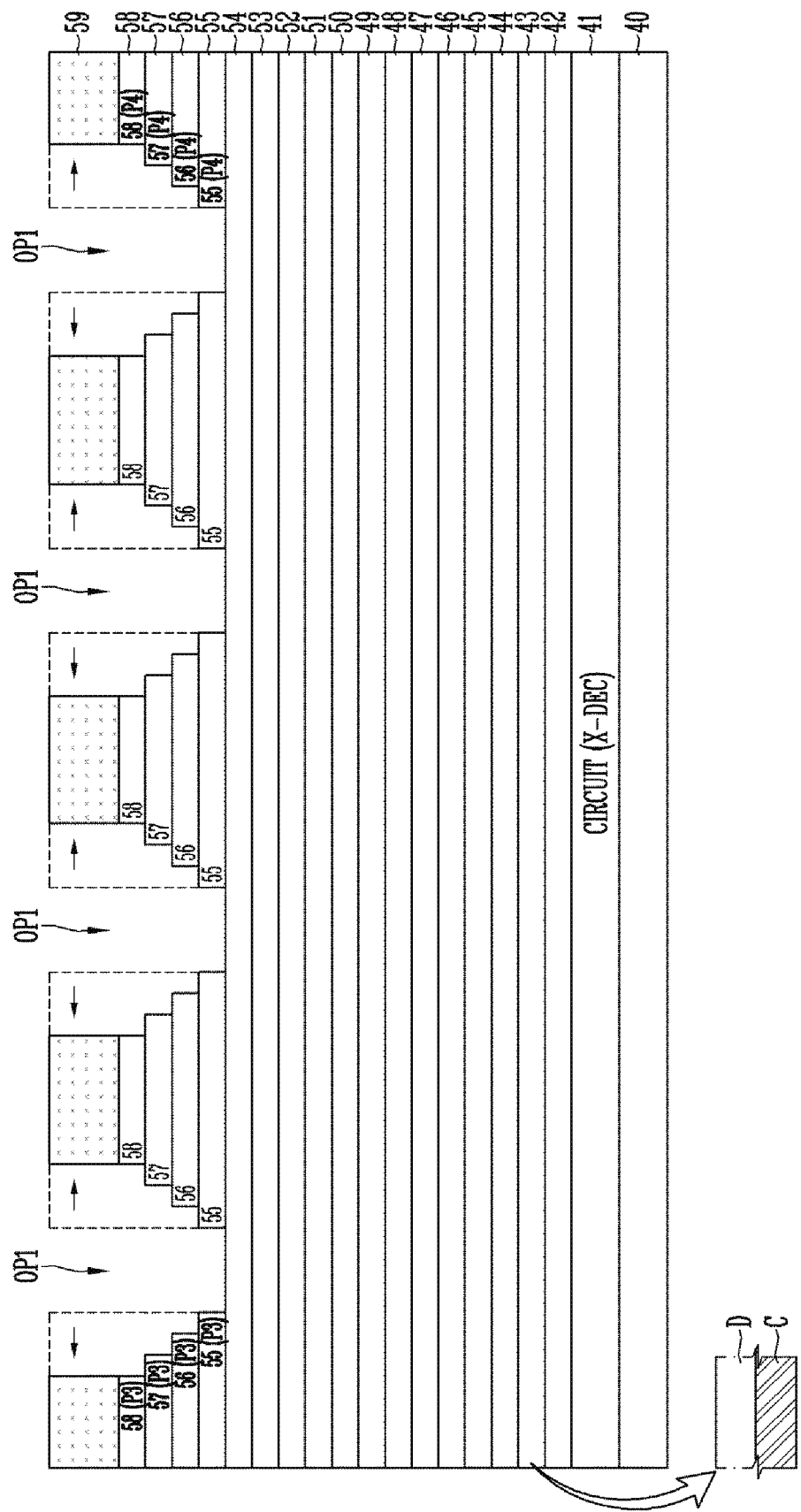

FIG. 5A
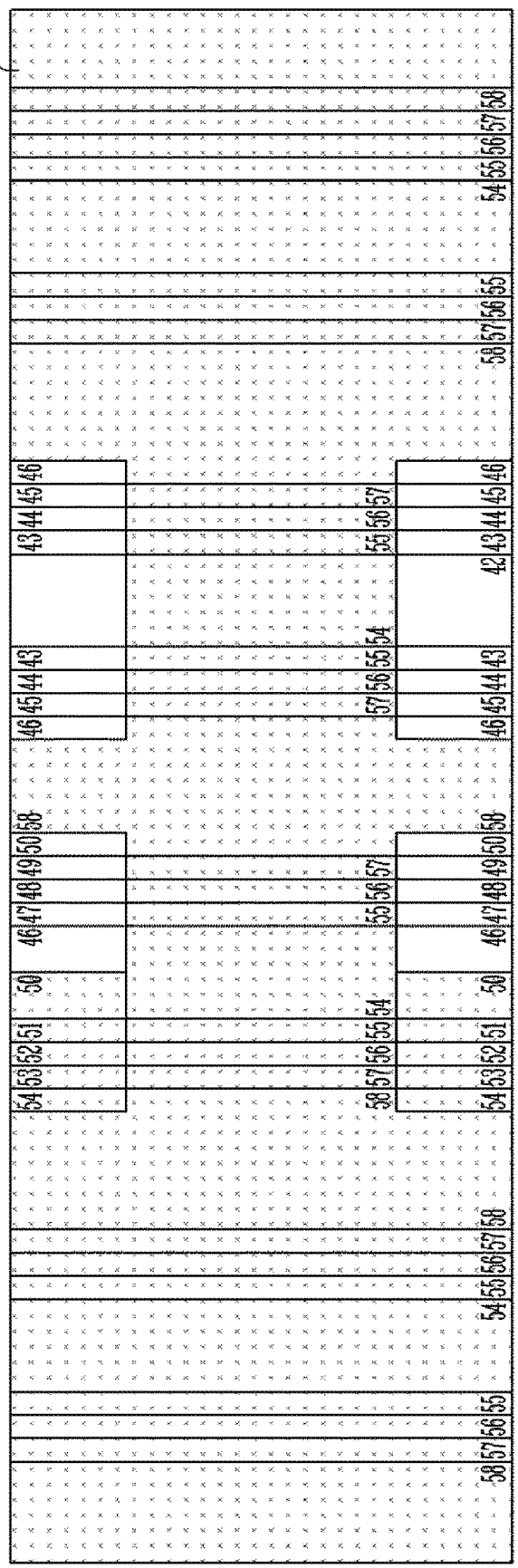
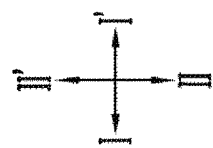

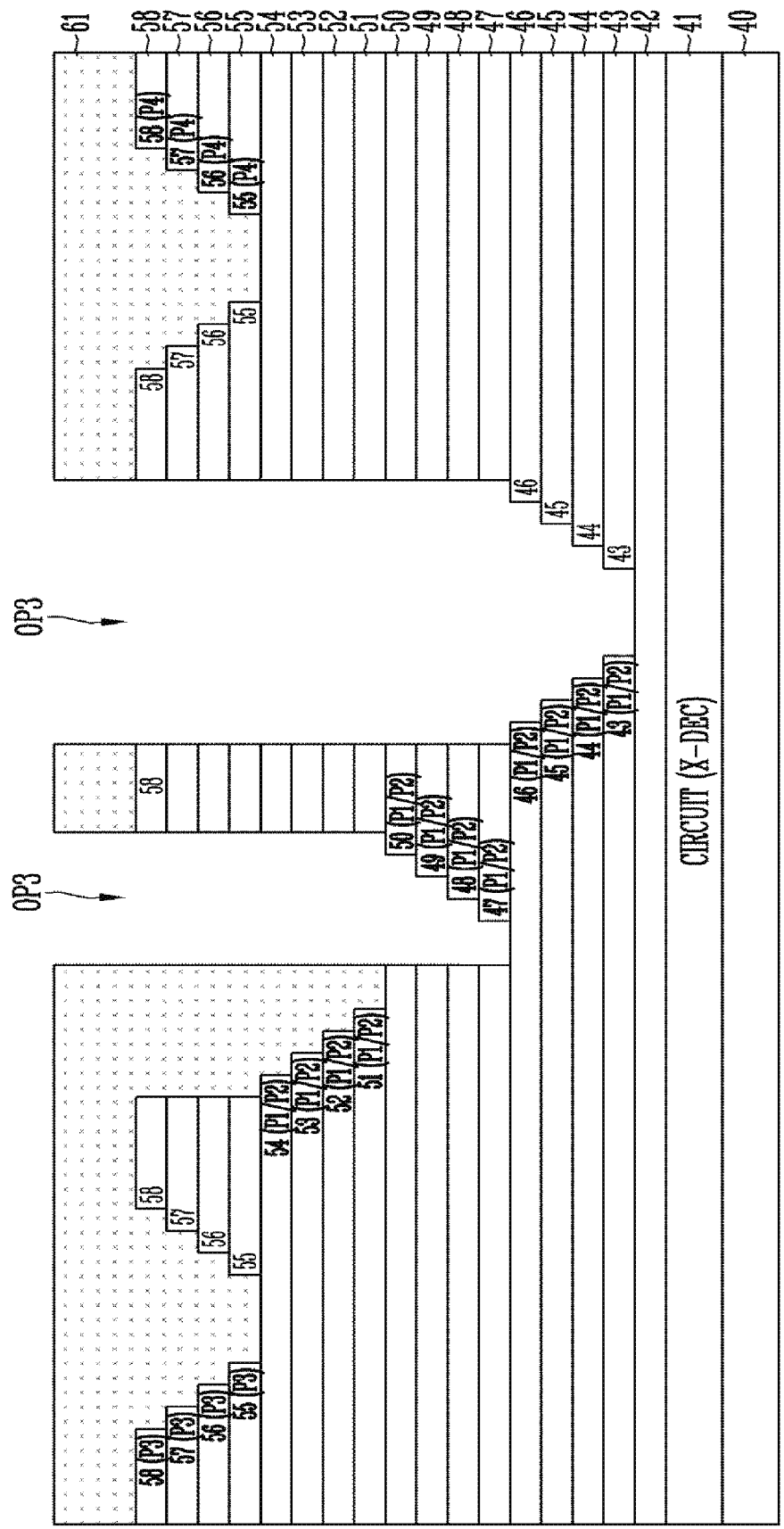

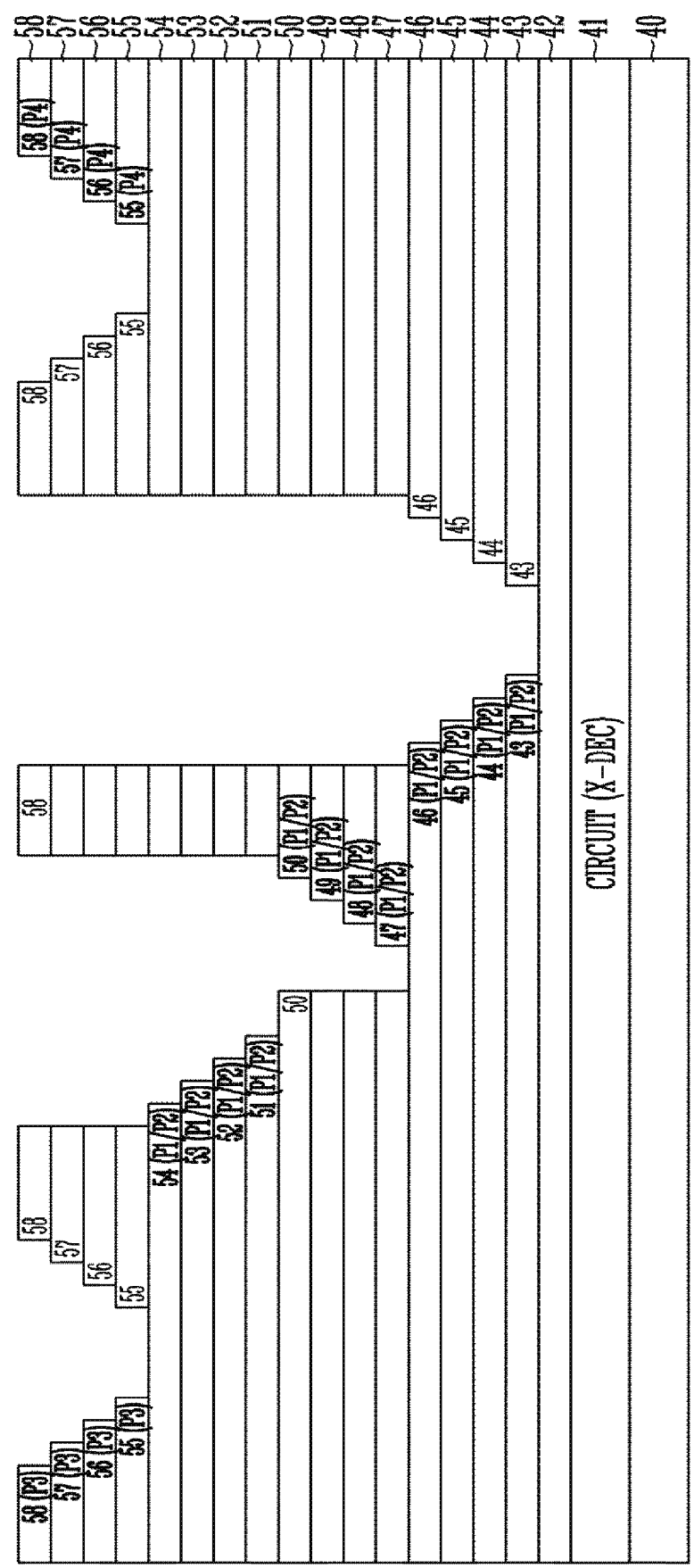

SEMICONDUCTOR DEVICE AND METHOD OF MANUFACTURING THE SAME

CROSS-REFERENCE TO RELATED APPLICATION

The present application is a continuation application for U.S. patent application Ser. No. 16/159,360, filed on Oct. 12, 2018, which is a continuation application for U.S. patent application Ser. No. 15/268,832, filed on Sep. 19, 2016, and claims priority under 35 U.S.C. § 119(a) to Korean patent application number 10-2016-0054202 filed on May 2, 2016, which is incorporated herein by reference in its entirety.

BACKGROUND

1. Technical Field

Various embodiments of the present disclosure generally relate to an electronic device and a method of manufacturing the same, and more particularly to a three-dimensional semiconductor device and a method of manufacturing the same.

2. Related Art

Non-volatile memory devices can retain stored data regardless of whether or not they are connected to power supplies. As a two-dimensional non-volatile memory technology is reaching its physical scaling limit, some semiconductor manufacturers are producing a three-dimensional (3D) non-volatile memory device by stacking memory cells on top of each other on a substrate.

A three-dimensional memory device may include gate electrodes stacked alternately with interlayer insulating layers, and may also include channel layers passing through the gate electrodes and interlayer insulating layers. To improve reliability of the three-dimensional non-volatile memory device, various structures and manufacturing methods are being developed.

SUMMARY

According to an embodiment, a semiconductor device may include a first cell structure, a second cell structure, a pad structure, a circuit, and an opening. The pad structure may include a first stepped structure and a second stepped structure located between the first cell structure and the second cell structure. The first stepped structure may include first pads electrically connected to the first and second cell structures and stacked on top of each other, and the second stepped structure may include second pads electrically connected to the first and second cell structures and stacked on top of each other. The circuit may be located under the pad structure. The opening may pass through the pad structure to expose the circuit, and may be located between the first stepped structure and the second stepped structure to insulate the first pads and the second pads from each other.

According to an embodiment, a semiconductor device may include a first cell structure, a pad structure, a circuit, a first dummy stepped structure, and a second dummy stepped structure. The first cell structure may include first to $4n^{th}$ layers. The pad structure may be electrically connected to the first cell structure. The circuit may be located under the pad structure. The pad structure may include a first stepped structure including first pads stacked on top of each other, a second stepped structure including second pads stacked on top of each other, an opening passing through the pad structure to expose the circuit and located between the first stepped structure and the second stepped structure to insulate the first pads and the second pads from each other. The first dummy stepped structure may be located between the first stepped structure and the opening, and may include first wiring lines stacked on top of each other. The first wiring lines may electrically connect the first pads to the first to $3n^{th}$ layers of the first cell structure. The second dummy stepped structure may be located between the second stepped structure and the opening and including second wiring lines stacked on top of each other. The second wiring lines may electrically connect the second pads to the first to $3n^{th}$ layers of the first cell structure.

According to an embodiment, a method of manufacturing a semiconductor device may include forming a circuit in a pad region of a substrate including a first cell region, the pad region and a second cell region sequentially arranged in a first direction. The method may include forming a stacked structure including first to 4nth layers stacked on the substrate in which the circuit is formed (where n is a natural number of 2 or more). The method may include forming a first cell structure in the first cell region, a second cell structure in the second cell region, and a pad structure in the pad region by partially patterning the pad region of the stacked structure. The pad structure may include a first stepped structure including first pads stacked on top of each other, the first pads electrically connected to the first and second cell structures, and a second stepped structure including second pads stacked on top of each other, the second pads electrically connected to the first and second cell structures. The method may include forming an opening through the stacked structure to expose the circuit. The opening may be located between the first stepped structure and the second stepped structure to insulate the first pads and the second pads from each other.

BRIEF DESCRIPTION OF THE DRAWINGS

FIGS. 1A to 1D are diagrams illustrating an example structure of a semiconductor device according to an embodiment.

FIGS. 2A to 2E are diagrams illustrating an example structure of a semiconductor device according to an embodiment.

FIGS. 3A, 3B, 4A, 4B, 5A, 5B, 6A, and 6B are diagrams illustrating an example of a method of manufacturing a semiconductor device according to an embodiment.

DETAILED DESCRIPTION

Figure 1A:
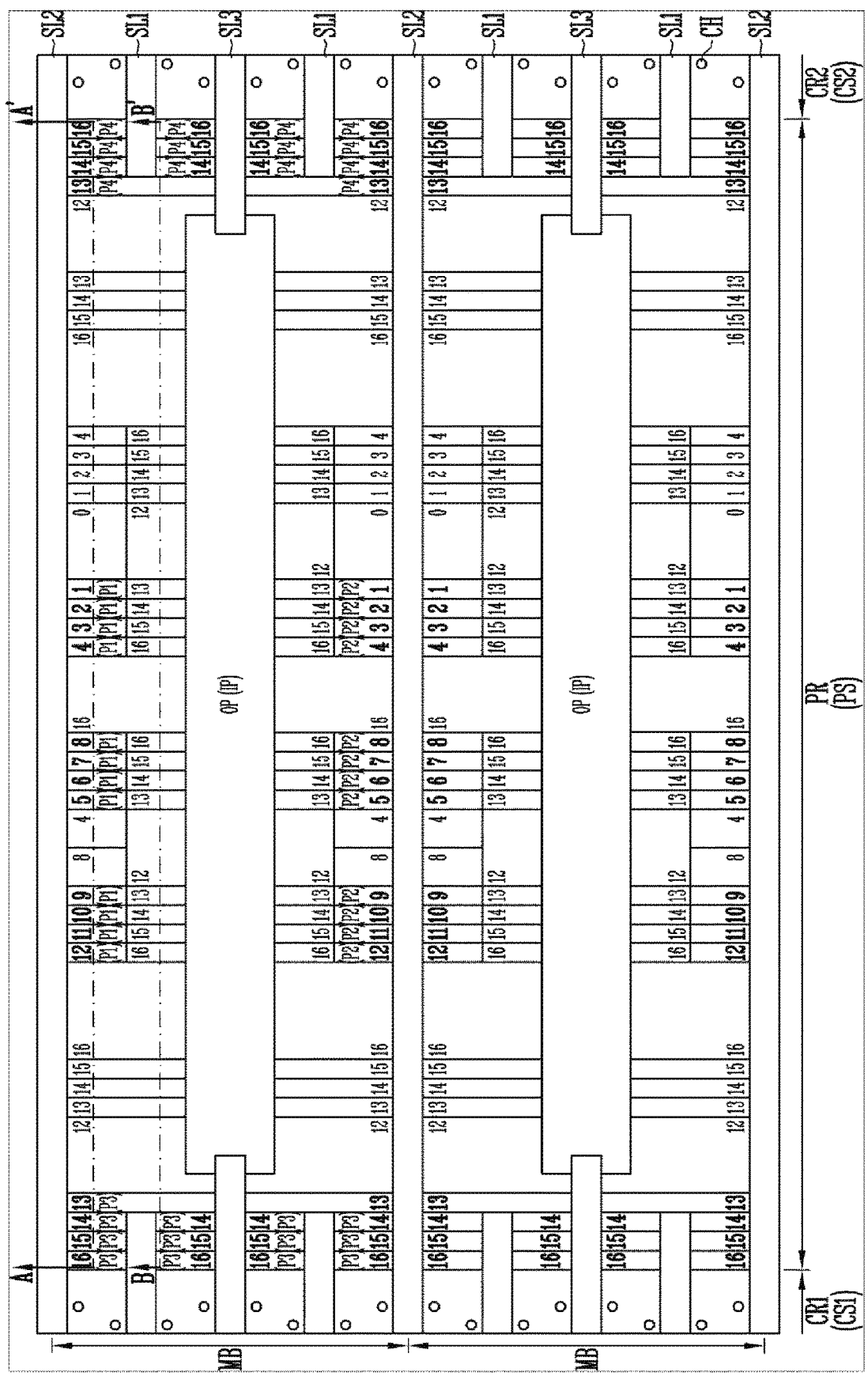

Hereinafter, various example embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

Figure 1B:
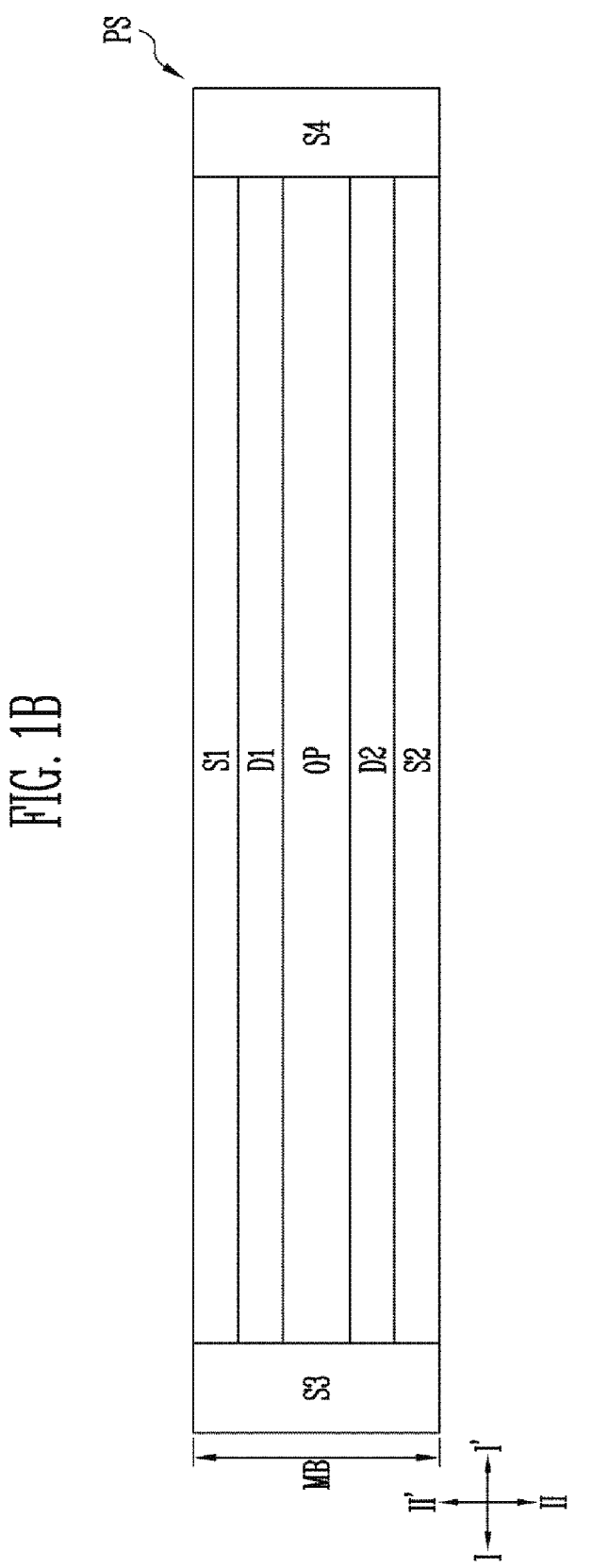

FIGS. 1A to 1D are diagrams illustrating an example structure of a semiconductor device according to an embodiment. FIGS. 1A and 1B are layout views. FIG. 1C is a cross-sectional view taken along line A-A' of FIG. 1A. FIG. 1D is a cross-sectional view taken along line B-B' of FIG. 1A.

Referring to FIGS. 1A and 1B, a semiconductor device according to an embodiment may include a substrate, cell structures CS1 and CS2, a pad structure PS and a circuit. The substrate may include cell regions CR1 and CR2 and a pad region PR. For example, the pad region PR may be located between the first cell region CR1 and the second cell region CR2. In addition, the semiconductor device may perform an erase operation on a block basis. Each memory block MB may include the first cell region CR1, the second cell region CR2, and the pad region PR located between the first cell region CR1 and the second cell region CR2.

The cell structures CS1 and CS2 may be located in the cell regions CR1 and CR2 of the substrate, respectively. The cell structures CS1 and CS2 may include a stacked series of conductive layers interleaved with insulating layers, and may also include channel layers CH passing through the stacked series of conductive layers and insulating layers. At least one of the lowermost conductive layers may be a lower selection line, and at least one of the uppermost conductive layer may be an upper selection line. The remaining conductive layers may be word lines. As a result, at least one lower selection transistor, a plurality of memory cells and at least one upper selection transistor that are connected in series to each other may form a single memory string. Memory strings may be arranged in a vertical direction.

For example, the first cell structure CS1 may include at least one first lower selection line, a plurality of first word lines and at least one first upper selection line that are sequentially stacked on top of each other. The second cell structure CS2 may include at least one second lower selection line, a plurality of second word lines and at least one second upper selection line that are sequentially stacked on top of each other. In addition, the first cell structure CS1 may include first vertical memory strings, and the second cell structure CS2 may include second vertical memory strings.

The pad structure PS may be located in the pad region PR of the substrate. For example, the pad structure PS may be located between the first cell structure CS1 and the second cell structure CS2. In addition, the circuit may be located under the pad structure PS, and at least a portion of the circuit may be exposed through an opening OP passing through the pad structure PS. The opening OP may be filled with an insulating pattern IP. The first cell structure CS1, the pad structure PS and the second cell structure CS2 may be sequentially arranged in a first direction I-I'. In addition, the opening OP may have a linear shape extending in the first direction I-I'.

The pad structure PS may include a stacked series of conductive layers interleaved with insulating layers. The first cell structure CS1, the second cell structure CS2 and the pad structure PS may be electrically connected to the pad structure PS. For example, the pad structure PS may be partially patterned into stepped structures having various depths, so that pads P1 to P4 for respectively applying a bias to the stacked conductive layers may be formed. In addition, non-patterned portions of the conductive layers of the pad structure PS may function as wiring lines electrically connecting the pads P1 to P4 to the conductive layers of the cell structures CS1 and CS2.

The pad structure PS may include a first stepped structure S1 and a second stepped structure S2, which are disposed at both sides of the opening OP. For example, the first stepped structure S1 may include first pads P1 located at one side of the opening OP. The second stepped structure S2 may include second pads P2 located at the other side of the opening OP. The first stepped structure S1 and the second stepped structure S2 may have a structure that is symmetrical about the opening OP1.

The pad structure PS may include a first dummy stepped structure D1, which is located between the first stepped structure S1 and the opening OP, and a second dummy stepped structure D2, which is located between the second stepped structure S2 and the opening OP. The first stepped structure S1, the first dummy stepped structure D1, the opening OP, the second dummy stepped structure D2 and the second stepped structure S2 may be sequentially arranged in a second direction II-II'.

The first dummy stepped structure D1 may include first wiring lines stacked on top of each other. The first wiring lines may electrically connect the first pads P1 to the first and second cell structures CS1 and CS2. The first dummy stepped structure D1 may have the same or greater height than the first stepped structure S1. The second dummy stepped structure D2 may include second wiring lines stacked on top of each other. The second wiring lines may electrically connect the second pads P2 to the first and second cell structures CS1 and CS2. The second dummy stepped structure D2 may have the same or greater height than the second stepped structure S2.

For example, the first pads P1 may be electrically connected to the first word line and the second word line disposed at the same level through the first wiring lines, or may be electrically connected to the first lower selection line and the second lower selection line disposed at the same level through the first wiring lines. In addition, the second pads P2 may be electrically connected to the first word line and the second word line disposed at the same level through the second wiring lines, or may be electrically connected to the first lower selection line and the second lower selection line disposed at the same level through the second wiring lines.

The pad structure PS may include a third stepped structure S3 contacting the first cell structure CS1 and a fourth stepped structure S4 contacting the second cell structure CS2. The third stepped structure S3 may be located between the first cell structure CS1 and the opening OP, and may include third pads P3 stacked on top of each other. In addition, the fourth stepped structure S4 may be located between the second cell structure CS2 and the opening OP, and may include fourth pads P4 stacked on top of each other. The third stepped structure S3 and the fourth stepped structure S4 may have a structure that is symmetrical about the opening OP.

For example, the third pads P3 may directly contact and be electrically connected to the first upper selection line at the same level, or may directly contact and be electrically connected to the first word line at the same level. The fourth pads P4 may directly contact and be electrically connected to the second upper selection line at the same level, or may directly contact and be electrically connected to the second word line at the same level.

A first slit SL1 may be located in each memory block MB. The first slit SL1 may separate upper selection lines of neighboring channel layers CH from each other. The first slit SL1 may pass through the second cell stacked structure CS2 in a stacking direction to an extent that the depth of the first slit SL1 is enough to pass through the second upper selection line. The first slit SL1 may extend in the first direction I-I' and partially pass through the fourth stepped structure S4 to separate, among the fourth pads P4, the fourth pads P4 coupled to the second upper selection line. Similarly, the first slit SL1 may be located to pass through the first cell stacked structure CS1 and the third stepped structure S3.

A second slit SL2 may be located at a boundary between neighboring memory blocks MB. The second slit SL2 may electrically separate the neighboring memory blocks MB and have enough depth to completely pass through the cell stacked structures CS1 and CS2 and the pad structure PS in a stacking direction in which the layers are stacked.

In addition, a third slit SL3 may be located in each memory block MB. The third slit SL3 may extend in the first direction I-I' and overlap at least a portions of the opening OP. The third slit SL3 may have enough depth to completely pass through the cell stacked structures CS1 and CS2 and the pad structure PS in the stacking direction. However, the first to third slits SL1 to SL3 may have various depths depending on shapes of a lower selection line, a word line and an upper selection line.

Referring to FIG. 1C, the pad structure PS may be located in the pad region PR of the substrate 20, and a circuit CIRCUIT may be located under the pad structure PS. The circuit CIRCUIT may be an X-decoder X-DEC. The pad structure PS may include stacked layers 0 to 16, each of which may include a conductive layer A and an insulating layer B. For example, each of the layers 0 to 16 may include the lower conductive layer A and the upper insulating layer B, or the upper conductive layer A and the lower insulating layer B.

The first stepped structure S1 may include the first pads P1 of the first to twelfth layers 1 to 12. The first to third layers 1 to 3 may be electrically connected to the first lower selection lines of the first vertical memory string and the second lower selection lines of the second vertical memory strings. The fourth to twelfth layers 4 to 12 may be electrically connected to the first word lines of the first vertical memory string and the second word lines of the second vertical memory string.

The third stepped structure S3 may include the third pads P3 of the thirteenth to sixteenth layers 13 to 16. The thirteenth layer 13 may be electrically connected to the first word line of the first vertical memory string. In addition, the fourteenth to sixteenth layers 14 to 16 may be electrically connected to the first upper selection line of the first vertical memory string.

The fourth stepped structure S4 may include the fourth pads P4 of the thirteenth to sixteenth layers 13 to 16. The thirteenth layer 13 may be electrically connected to the second word line of the second vertical memory string. In addition, the fourteenth to sixteenth layers 14 to 16 may be electrically connected to the second upper selection line of the second vertical memory string.

Referring to FIG. 1D, the first dummy stepped structure D1 may include the stacked layers 0 to 16. The first to twelfth layers 1 to 12 electrically connected to the first pads P1 may function as first wiring lines L1. Referring to FIG. 1C, it is shown that the first pads P1 of the ninth to twelfth layers 9 to 12 are electrically connected to only the first cell structure CS1. However, referring to FIG. 1D, the first pads P1 of the ninth to twelfth layers 9 to 12 are electrically connected to the second cell structure CS2 through the first wiring lines L1. Similarly, referring to FIG. 1C, it is shown that the first pads P1 of the fifth to eighth layers 5 to 8 electrically float. However, referring to FIG. 1D, the first pads P1 of the fifth to eighth layers 5 to 8 and the first and second cell structures CS1 and CS2 are electrically connected to each other through the first wiring lines L1.

Accordingly, the first cell structure CS1 and the second cell structure CS2 may be located at both sides of the pad structure PS, and the first cell structure CS1 and the second cell structure CS2 may share the pad structure PS. Therefore, the distance between the circuit CIRCUIT and the cell structures CS1 and CS2 may be shorter than that of a possible configuration that arranges a circuit at only one side of a cell region, and thus RC delay may be reduced and the program speed may be increased.

In addition, since the circuit CIRCUIT and the opening OP are located at the center of the pad region PR and the pads are disposed at both sides of the opening OP, an area of the pad region PR may be reduced. In addition, processes may be simplified since the pads are formed by partially patterning the stacked layers and the stacked layers of the dummy stepped structure are used as wiring lines.

FIGS. 2A to 2E are diagrams illustrating an example structure of a semiconductor device according to an embodiment. The example structure of the semiconductor device here may include features that are the same as or similar to those previously discussed, and thus any repetitive detailed description will be omitted or simplified.

Figure 2B:
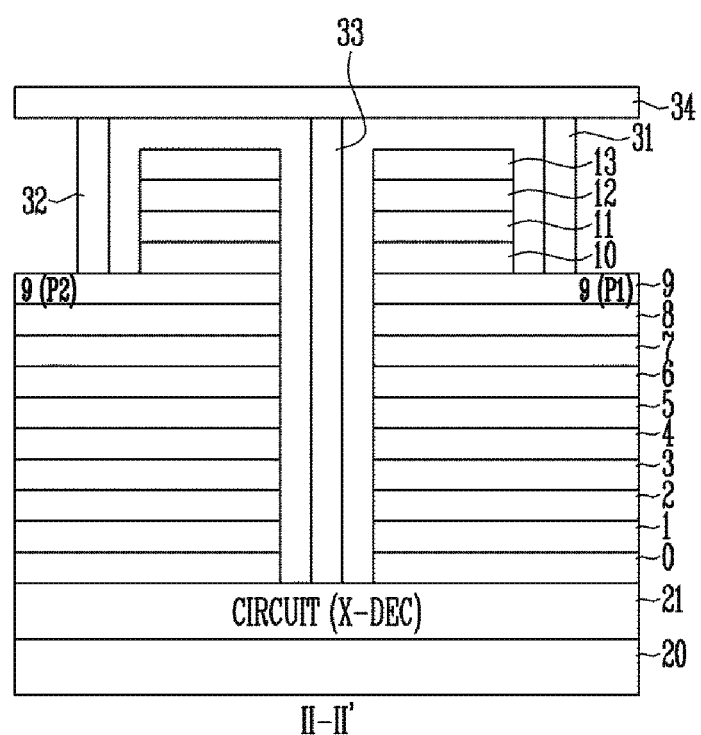

FIG. 2A is a layout view of an interconnection structure. For convenience of explanation, interconnects and pads are illustrated in detail, whereas some other parts of the interconnection structure are not illustrated in detail. FIG. 2B is a cross-sectional view taken in the first direction I-I' and illustrating a first interconnection structure C1. Referring to FIGS. 2A and 2B, among the first pads P1 of the ninth to twelfth layers 9 to 12 of the first stepped structure S1 and the second pads P2 of the ninth to twelfth layers 9 to 12 of the second stepped structure S2, the first pad P1 and the second pad P2 disposed at the same level may be electrically connected to each other by the first interconnection structure C1. In addition, the first interconnection C1 may couple the electrically connected first and second pads P1 and P2 in common to the circuit CIRCUIT. The third pad P3 of the thirteenth layer 13 may also be electrically connected by the first interconnection C1. In addition, the third pad P3 may also be connected to the circuit CIRCUIT by the first interconnection C1. Depending on a driving method, the third pad P3 may not be connected to circuit CIRCUIT.

For example, the first interconnection structure C1 may include a first contact plug 31 coupled to the first pad P1, a second contact plug 32 coupled to the second pad P2, a third contact plug 33 located in the opening OP and coupled to the circuit CIRCUIT, and a wiring line 34 electrically connecting the first to third contact plugs 31 to 33 to each other and extending in the second direction II-II'.

FIG. 2C is a cross-sectional view taken in the first direction I-I' and illustrating the second interconnection structure C2. Referring to FIGS. 2A and 2C, the third pad P3 and the fourth pad P4 disposed at the same level, among the third pads P3 of the third stepped structure S3 and the fourth pads P4 of the fourth stepped structure S4, may be electrically connected to the second interconnection structure C2. For example, the second interconnection structure C2 may include first contact plugs 35 respectively coupled to the third pads P3, the second contact plugs 36 respectively coupled to the fourth pads P4, and wiring lines 37 electrically connecting the first contact plugs 35 and the second contact plugs 36. Although it is illustrated that one vertical memory string includes three upper selection transistors and gate electrodes of upper selection transistors are electrically connected to each other, the invention is not limited thereto.

Figure 2D:
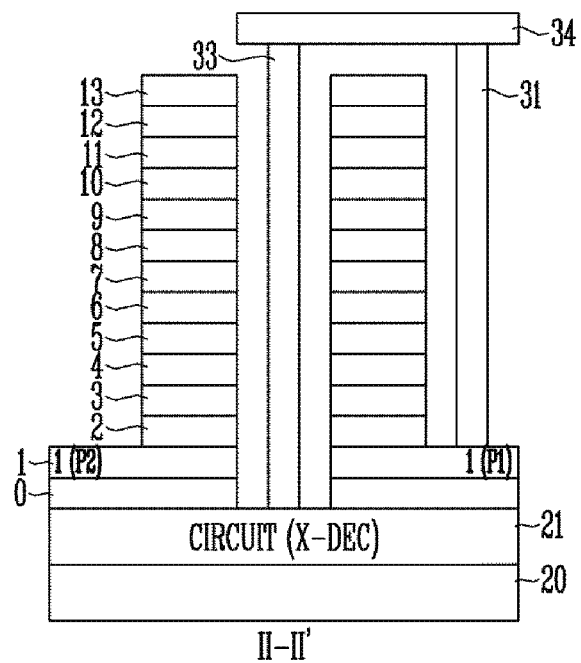
Figure 2E:
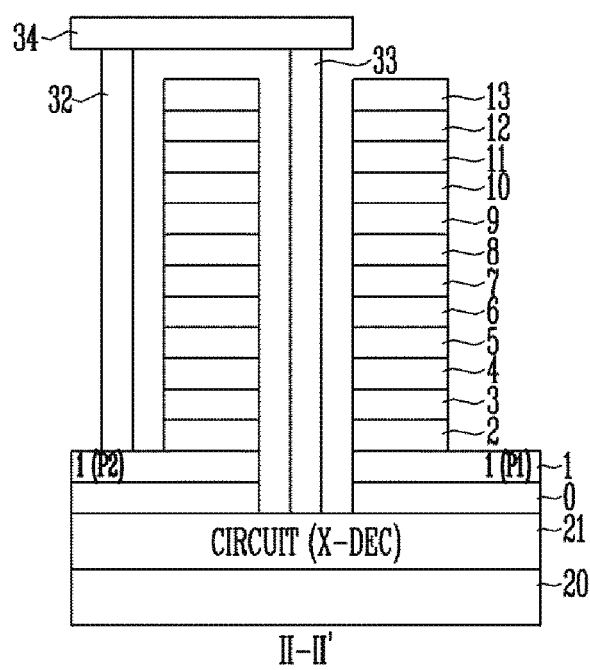

FIGS. 2D and 2E are cross-sectional views taken in the second direction II-II' and illustrating a third interconnection structure C3 and a fourth interconnection structure C4. Referring to FIGS. 2A, 2D, and 2E, the first pads P1 of the first to third layers 1 to 3 of the first stepped structure S1 may be electrically connected to the circuit CIRCUIT by the third interconnection structure C3. The third interconnection structure C3 may include the first contact plugs 31 coupled to the first pads P1, the third contact plug 33 coupled to the circuit CIRCUIT, and the wiring lines 34 electrically connecting the first contact plugs 31 to the third contact plug 33. In addition, the second pads P2 of the first to third layers 1 to 3 of the second stepped structure S2 may be electrically connected to the circuit CIRCUIT by the fourth interconnection structure C4. The fourth interconnection structure C4 may include the second contact plugs 32 coupled to the second pads P2, the third contact plug 33 coupled to the circuit CIRCUIT, and the wiring lines 34 electrically connecting the second contact plugs 32 to the third contact plug 33.

As for the first to third layers 1 to 3 corresponding to first and second lower selection lines, by connecting the first pads P1 and the second pads P2 to the circuit, the first lower selection line and the second lower selection line may be independently driven.

Although it is illustrated that a single vertical memory string includes three lower selection transistors, ten memory cells and three upper selection transistors, the invention is not limited thereto. The type and number of transistors included in a single vertical memory string may vary. Therefore, the number of stacked layers and the shape of the pattern for forming the pad structure PS may vary accordingly.

FIGS. 3A to 6B are diagrams illustrating an example of a method of manufacturing a semiconductor device according to an embodiment. FIGS. 3A, 4A, 5A and 6A are layout views, and FIGS. 3B, 4B, 5B, and 6B are cross-sectional views.

Referring to FIGS. 3A and 3B, a stacked structure including a plurality of layers 42 to 58 stacked on top of each other may be formed on the substrate 20. For example, the substrate 20 may include a cell region and a pad region. The pad region may be located between a first cell region and a second cell region. The plurality of layers 42 to 58 may be formed in the first cell region, the pad region and the second cell region.

Each of the layers 42 to 58 may include a first material layer C and a second material layer D. For example, each of the layers 42 to 58 may include the lower first material layer C and the upper second material layer D, or may include the upper first material layer C and the lower second material layer D.

The first material layers C may be provided to form conductive layers such as a word line, a selection line, and a pad. The second material layers D may insulate the stacked conductive layers from each other. For example, the first material layers C may include sacrificial layers containing nitrides, and the second material layers D may include insulating layers containing oxides. In another example, the first material layers C may include conductive layers containing polysilicon or tungsten, and the second material layers D may include insulating layers containing oxides. The first material layers C may include conductive layers containing doped polysilicon, and the second material layers D may include sacrificial layers containing undoped polysilicon.

Though not illustrated, channel layers passing through the stacked layers 42 to 58 in the cell region and data storage layers surrounding sidewalls of the respective channel layers may be formed. Examples of the data storage layers may include a floating gate containing a silicon-based conductive material, a charge trap layer containing a nonconductive material such as nitrides, a layer containing a phase change material, and a layer containing nanodots.

Subsequently, a first mask pattern 59 may be formed over the stacked structure. The first mask pattern 59 may be provided to form a dummy stepped structure, and may include first openings OP1 having a linear shape extending in the second direction II-II'. Subsequently, the layer 58 of the stacked layers 42 to 58 may be partially etched using the first mask pattern 59 as an etch barrier. The first mask pattern 59 may be reduced such that the first opening OP1 may extend in the first direction I-I'. Subsequently, the layers 58 and 57 of the stacked layers 42 to 58 may be etched using the reduced first mask pattern 59 as an etch barrier. By repetitively performing the etch process while reducing the first mask pattern 59 as described above, some (55 to 58) of the stacked layers 42 to 58 may be patterned into a plurality of n-level stepped structures. Here, n may be a natural number of 2 or more (e.g., n=4).

As a result, the first and second dummy stepped structures D1 and D2 described above with reference to FIGS. 1A and 1B may be formed. In addition, the third stepped structure S3, in which the third pads P3 of the stacked layers 55 to 58 coupled to the first cell structure CS1 are stacked, and the fourth stepped structure S4, in which the fourth pads P4 of the stacked layers 55 to 58 coupled to the second cell structure CS2 are stacked, may be formed. Subsequently, the first mask pattern 59 may be removed.

Figure 4A:
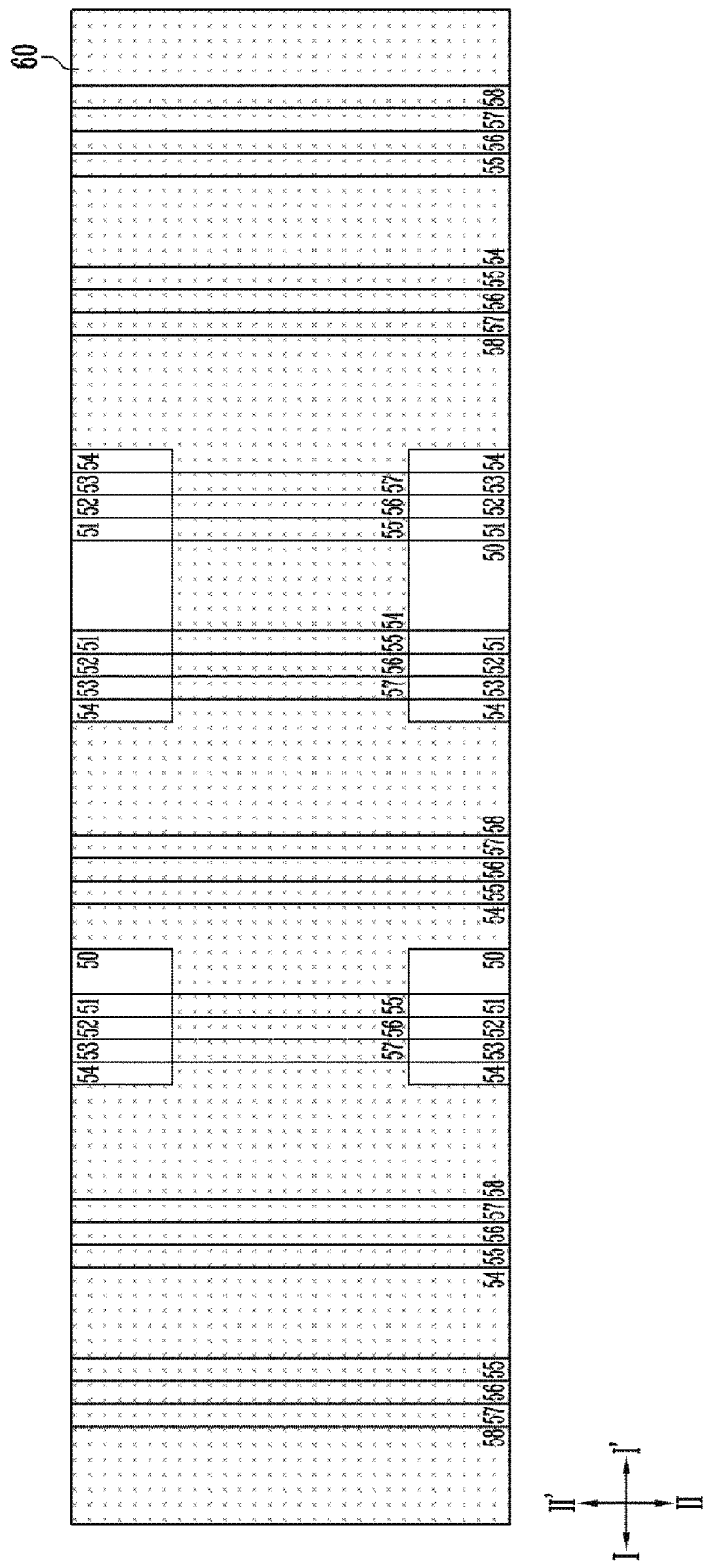
Figure 4B:
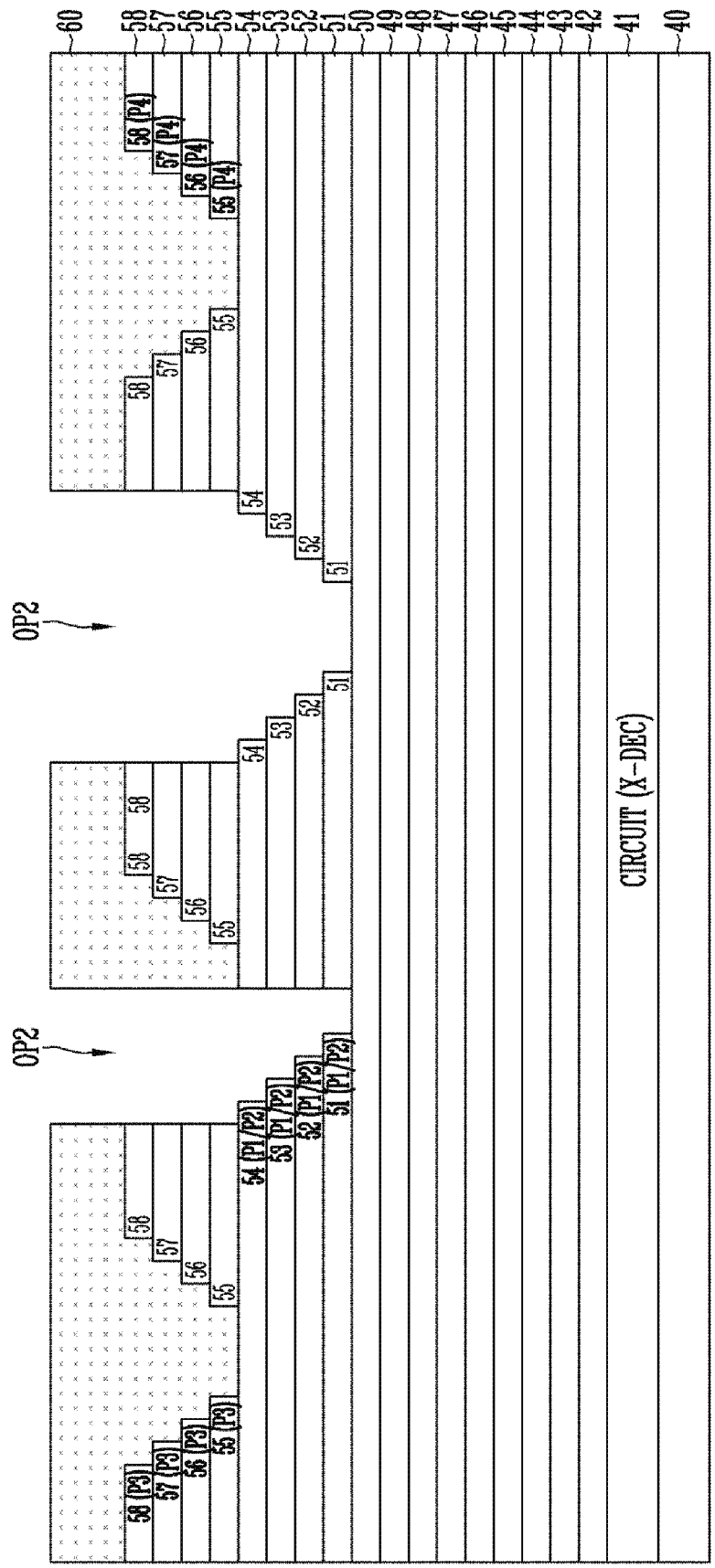

Referring to FIGS. 4A and 4B, a second mask pattern 60 may be formed over the stacked structure. The second mask pattern 60 may be used to form first and second stepped structures by partially patterning the stacked layers 51 to 58. The second mask pattern 60 may cover the first and second dummy stepped structures D1 and D2 and the third and fourth stepped structures S3 and S4, and may include second openings OP2 formed in the shape of an island to expose an area in which a stepped structure will be additionally formed. For example, the second openings P2 may include an opening exposing an area where pads of n lowermost layers will be formed, and may also include an opening where the first and second pads P1 and P2 of the stacked layers 51 to 54 will be formed.

Subsequently, the stacked layers 51 to 58 may be partially etched using the second mask pattern 60 as an etch barrier. For example, the stacked layers 51 to 54 may be patterned into a step shape. As a result, some of the first and second pads P1 and P2 described above with reference to FIGS. 1A and 1B may be formed. For example, the first and second pads P1 and P2 of the stacked layers 51 to 54 may be formed. Subsequently, the second mask pattern 60 may be removed.

Referring to FIGS. 5A and 5B, a third mask pattern 61 may be formed over the stacked structure. The third mask pattern 61 may be used to partially pattern the stacked layers 42 to 58 to form first and second stepped structures. The third mask pattern 61 may cover the first and second dummy stepped structures D1 and D2, the third and fourth stepped structures S3 and S4, and the first and second pads P1 and P2. The third mask pattern 61 may include third openings OP3 formed in the shape of an island to expose an area where a stepped structure will be additionally formed. For example, the third openings P3 may include an opening exposing an area where n lowermost pads will be formed, and an opening exposing an area where the first and second pads P1 and P2 of the stacked layers 43 to 50 will be formed.

Subsequently, the stacked layers 43 to 58 may be etched using the third mask pattern 61 as an etch barrier. For example, the stacked layers 43 to 50 may be patterned into a step shape by etching 2n (e.g., 2n=8) layers. As a result, some of the first and second pads P1 and P2 described above with reference to FIGS. 1A and 1B may be formed. For example, the first and second pads P1 and P2 of the stacked layers 43 to 50 may be formed. Subsequently, the third mask pattern 61 may be removed.

Depending on the number of layers included in the stacked structure, the total number of iterations of mask pattern forming processes and etching processes may be determined. For example, n layers may be etched from the stacked structure by using the second mask pattern 60, 2n layers may be etched from the stacked structure by using the third mask pattern 61, and 4n layers may be etched using a fourth mask pattern (not illustrated).

Figure 6A:
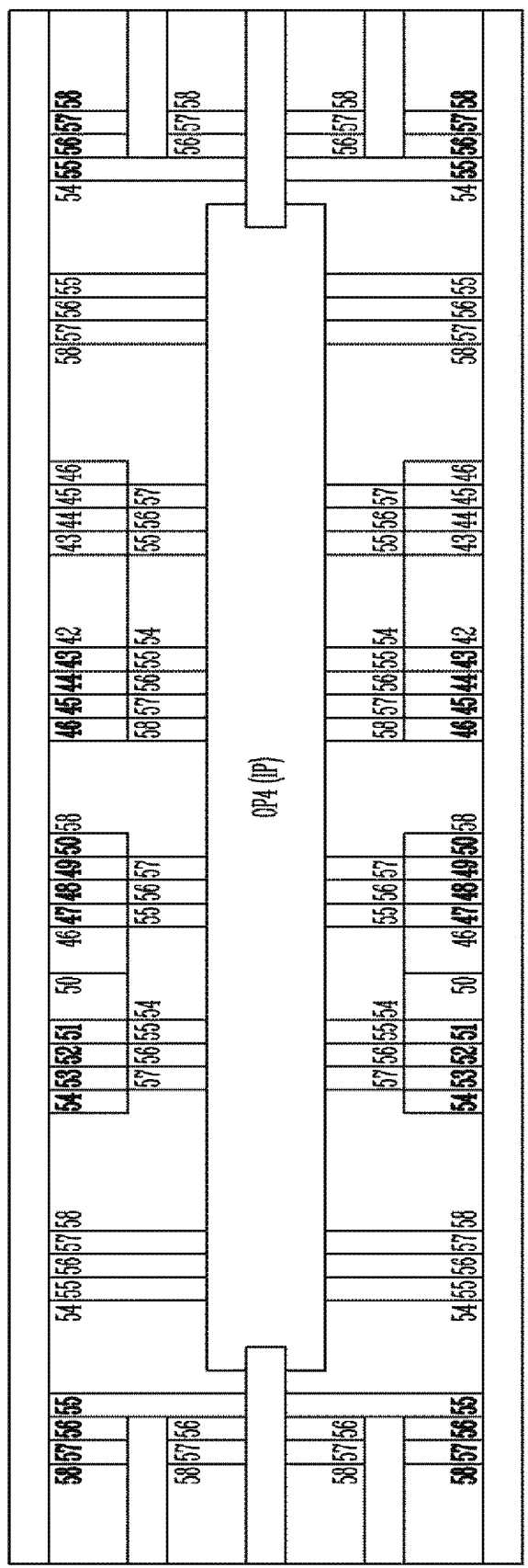

Referring to FIGS. 6A and 6B, after a fourth opening OP4 passing through the stacked layers 42 to 58 to is formed to expose the circuit CIRCUIT, an insulating pattern IP may be formed in the fourth opening OP4. After the first slits SL1 are formed in the memory block, a first slit insulating layer may be formed in the first slits SL1. The first slits SL1 may be deep enough to pass through the layers 56 to 58, which will be used as upper selection lines of a cell structure, and may extend to the pad region to insulate the pads P3 and P4 of the layers 56 to 58 from each other.

Subsequently, the second slits SL2 may be formed at the boundary between neighboring memory blocks, and the third slit SL3 may be formed in the memory block. The second and third slits SL2 and SL3 may be deep enough to completely pass through the stacked layers 42 to 58. Subsequently, first and second wiring lines of first and second dummy stepped structures and first to fourth pads of first to fourth stepped structures may be formed, and the second and third slits SL2 and SL3 may be used as a passage for materials that are inserted or removed while the stepped structures are being formed.

For example, if the first material layers C are sacrificial layers and the second material layers D are insulating layers, the first material layers C may be replaced by conductive layers through the second slits SL2. As a result, the first and second wiring lines of the first and second dummy stepped structures may be formed, and the first to fourth pads P1 to P4 of the first to fourth stepped structures may be formed. If the first material layers C are conductive layers and the second material layers D are insulating layers, the first material layers C may be silicided using the second slits SL2 as a passage for materials that are used for the silicization. As a result, resistances of the first and second wiring lines and the first to fourth pads P1 to P4 may be reduced. In another example, when the first material layers C are conductive layers and the second material layers D are sacrificial layers, the second material layers D may be replaced by insulating layers through the second slits SL2.

Subsequently, second and third slit insulating layers may be formed in the second and third slits SL2 and SL3, respectively. The third slit SL3 may overlap at least a part of the insulating pattern IP. Therefore, the stacked layers (42 to 58) of the first stepped structure and the first dummy structure may be separated from the stacked layers (42 to 58) of the second stepped structure and the second dummy structure by the insulating pattern IP and the third slit insulating layer.

Figure 7A:
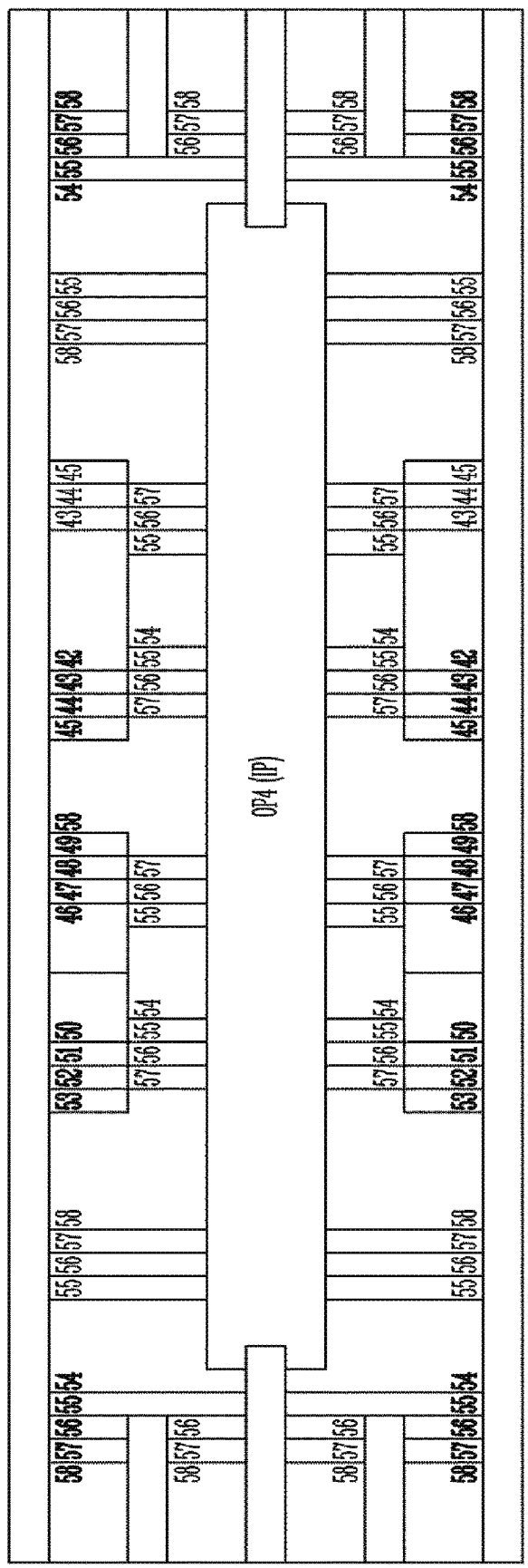
FIGS. 7A and 7B are diagrams illustrating an example structure of a semiconductor and a manufacturing method thereof according to an embodiment.
Figure 7B:
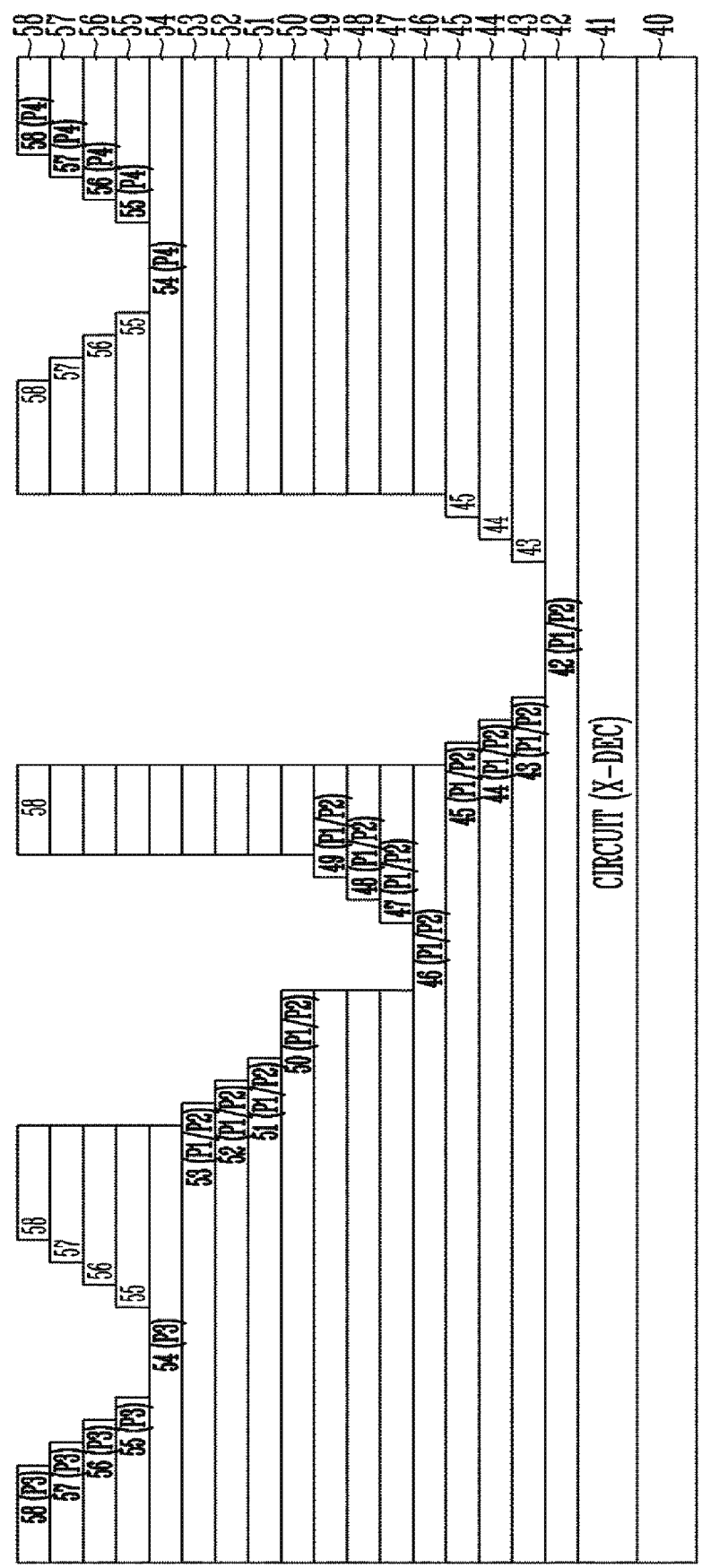

FIGS. 7A and 7B are diagrams illustrating an example structure of a semiconductor device and a manufacturing method thereof according to an embodiment. FIG. 7A is a layout view and FIG. 7B is a cross-sectional view. The pad structure that will be discussed below is similar to the pad structure PS described above with reference to FIGS. 2A to 2D, but the pattern shape of the first to fourth stepped structures and the positions of the pads are different from those of FIGS. 2A to 2D.

Referring to FIGS. 7A and 7B, the first stepped structure S1 may include the first pads P1 of the stacked layers 42 to 53, the second stepped structure S2 may include the second pads P2 of the stacked layers 42 to 53, the third stepped structure S3 may include the third pads P3 of the stacked layers 54 to 58, and the fourth stepped structure S4 may include the fourth pads P4 of the stacked layers 54 to 58. As a result, since the pads P1 to P4 are more densely located, the area of the pad structure may be reduced.

This structure may be formed by applying the manufacturing method described above with reference to FIGS. 3A to 6B. First, referring to FIGS. 3A and 3B, the third and fourth pads P3 and P4 of the stacked layers 54 to 58 may be formed by patterning the stacked layers 55 to 58 into a step shape by using the first mask pattern 59. Subsequently, referring to FIGS. 4A and 4B, the stacked layers 43 to 58 may be etched using the second mask pattern 60. For example, (n−1) layers or (n+1) layers may be etched. That is, if n is four, three layers or five layers may be etched. Subsequently, referring to FIG. 5A and FIG. 5B, the stacked layers 43 to 58 may be etched using the third mask pattern 61. For example, (2n+1) or (2n−1) layers may be etched. That is, if n is four, nine layers or seven layers may be etched. When the first to 4nth layers formed in the pad region are partially patterned, the stepped structure may be formed into various shapes by controlling the number of layers stacked.

Figure 8:
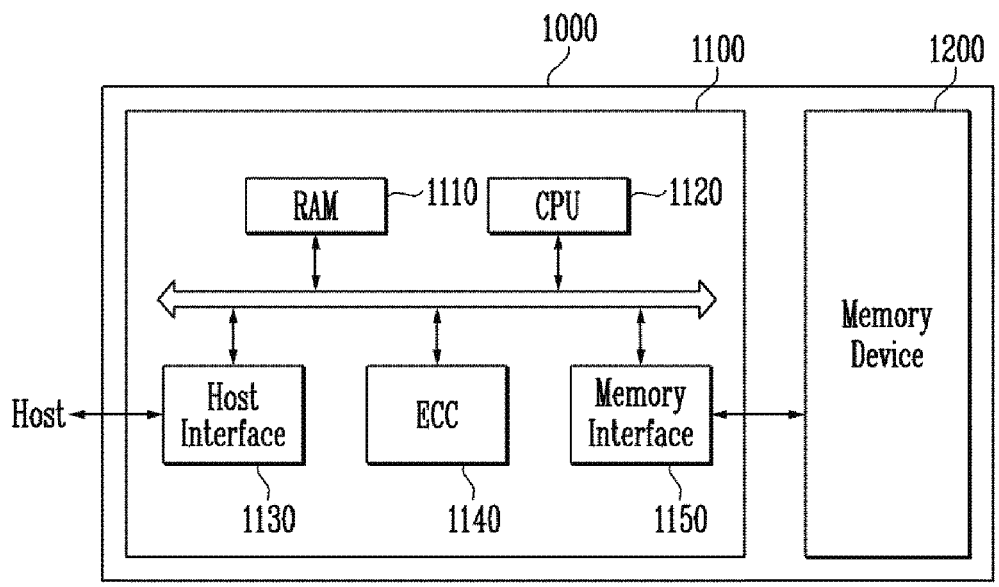
FIGS. 8 and 9 are diagrams illustrating an example configuration of a memory system according to an embodiment.

FIG. 8 is a diagram illustrating an example of a memory system 1000 according to an embodiment.

As illustrated in FIG. 8, the memory system 1000 according to an embodiment may include a memory device 1200 and a controller 1100.

The memory device 1200 may be used to store various types of data such as text, graphic, and software code. The memory device 1200 may be a non-volatile memory, and may include the structure described with reference to FIGS. 1A to 7B. In addition, the memory device 1200 may include a first cell structure, a second cell structure, a pad structure, a circuit, and an opening. The pad structure may be located between the first cell structure and the second cell structure, and may be electrically connected to the first and second cell structures. The circuit may be located under the pad structure. The pad structure may include an opening formed therethrough to expose the circuit. A first stepped structure may be located at one side of the opening, and may include first pads stacked on top of each other. A second stepped structure may be located at the other side of the opening, and may include second pads stacked on top of each other. Since the memory device 1200 may be configured and manufactured in the above-described manner, a detailed description thereof will be omitted.

The controller 1100 may be coupled to an external device (e.g., a host) and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may control general operations of the controller 1100. For example, the CPU 1120 may operate firmware such as a flash translation layer (FTL) stored in the RAM 110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) that may temporarily store data. The buffer memory may temporarily store data externally transferred through the host interface 1130, or may temporarily store data transferred from the memory device 1200 through the memory interface 1150. The controller 1100 may further include ROM storing code data to interface with the host.

Since the memory system 1000 according to an embodiment includes the memory device 1200 having improved integration density and characteristics, the memory system 1000 may be miniaturized while having good characteristics.

Figure 9:
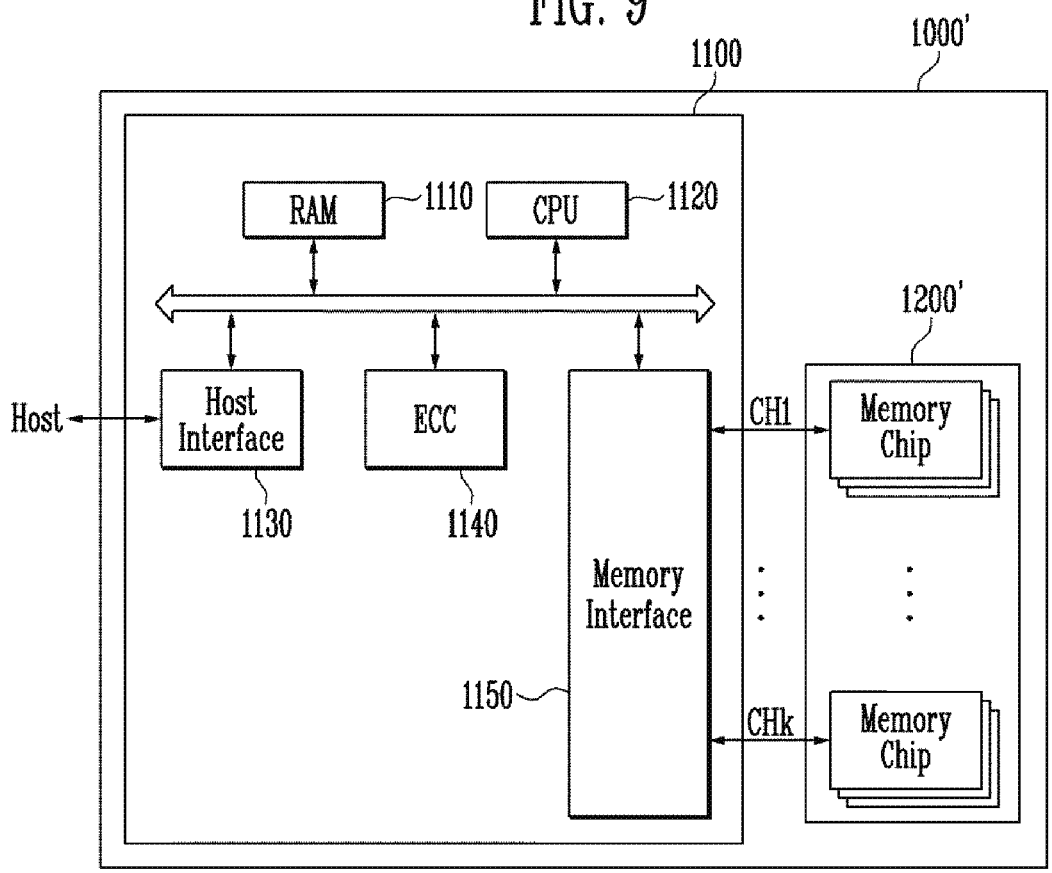

FIG. 9 is a diagram illustrating an example of a memory system 1000' according to an embodiment. Hereinafter, any repetitive detailed description will be omitted or simplified.

As illustrated in FIG. 9, the memory system 1000' according to an embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may include the memory cell strings described above with reference to FIGS. 1A to 7B. In addition, the memory device 1200' may include a first cell structure, a second cell structure, a pad structure, a circuit, and an opening. The pad structure may be located between the first cell structure and the second cell structure, and may be electrically connected to the first and second cell structures. The circuit may be located under the pad structure. The pad structure may include an opening formed therethrough to expose the circuit. A first stepped structure may be located at one side of the opening, and may include first pads stacked on top of each other. The second stepped structure may be located at the other side of the opening, and may include second pads stacked on top of each other. Since the memory device 1200' may be configured and manufactured in the above-described manner, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k$^{th}$ channels CH1 to CHk, respectively. In addition, memory chips included in a single group may be suitable for communicating with the controller 1100 through a common channel. The memory system 1000' may be modified so that a single memory chip may be coupled to a single channel.

As described above, according to an embodiment, since the memory system 1000' includes the memory device 1200' having improved integration density and characteristics, the memory system 1000' may be miniaturized while having good characteristics. In addition, since the memory device 1200' may be formed using a multi-chip package, data storage capacity and the overall performance of the memory system 1000' may be improved.

Figure 10:
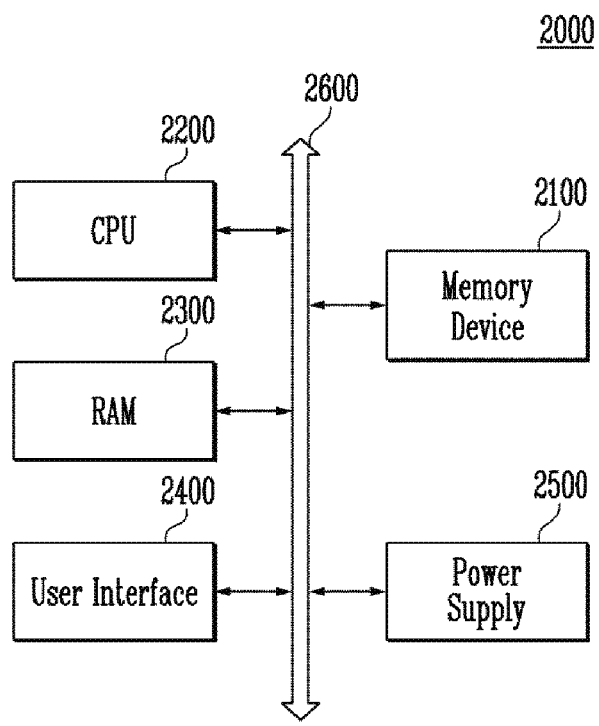
FIGS. 10 and 11 are diagrams illustrating an example configuration of a computing system.

FIG. 10 is a diagram illustrating an example of a computing system 2000 according to an embodiment. Hereinafter, any repetitive detailed description will be omitted or simplified.

As illustrated in FIG. 10, the computing system 2000 according to an embodiment may include a memory device 2100, a CPU 2200, a random-access memory (RAM) 2300, a user interface 2400, a power supply 2500, and a system bus 2600.

The memory device 2100 may store data input through the user interface 2400 and data processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or may be directly coupled to the system bus 2600. When the memory device 2100 is directly coupled to the system bus 2600, the CPU 2200 and the RAM 2300 may serve as the controller.

The memory device 2100 may be a non-volatile memory. The memory device 2100 may be the memory string described above with reference to FIGS. 1A to 7B. The memory device 2100 may include a first cell structure, a second cell structure, a pad structure, a circuit, and an opening. The pad structure may be located between the first cell structure and the second cell structure, and may be electrically connected to the first and second cell structures. The circuit may be located under the pad structure. The pad structure may include an opening formed therethrough to expose the circuit. A first stepped structure may be located at one side of the opening, and may include first pads stacked on top of each other. The second stepped structure may be located at the other side of the opening, and may include second pads stacked on top of each other. Since the memory device 2100 may be configured and manufactured in the same manner as described above, a detailed description thereof will be omitted.

In addition, as described above with reference to FIG. 9, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to an embodiment includes the memory device 2100 having improved integration density and characteristics, characteristics of the computing system 2000 may also be improved.

Figure 11:
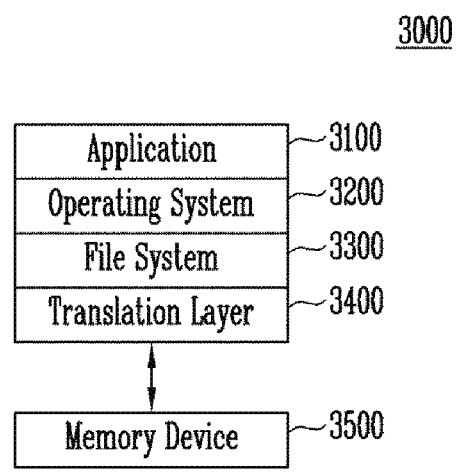

FIG. 11 is a diagram illustrating an example of a computing system 3000 according to an embodiment.

As illustrated in FIG. 11, a computing system 3000 according to an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 11 illustrates the operating system 3200, the application 3100, and the file system 3300 in separate blocks. However, the application 3100 and the file system 3300 may be included in the operating system 3200.

The translation layer 3400 may translate an address suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may include the memory string described above and shown in FIGS. 1A to 7B. The memory device 3500 may include a first cell structure, a second cell structure, a pad structure, a circuit, and an opening. The pad structure may be located between the first cell structure and the second cell structure, and may be electrically connected to the first and second cell structures. The circuit may be located under the pad structure. The pad structure may include an opening formed therethrough to expose the circuit. A first stepped structure may be located at one side of the opening and including first pads stacked on each other. A second stepped structure may be located at the other side of the opening and including second pads stacked on each other. Since the memory device 3500 may be configured and manufactured the same as the memory devices 1200, 1200' or 2100, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to an embodiment includes the memory device 3500 having improved integration density and characteristics, characteristics of the computing system 2000 may also be improved.

In accordance with various embodiments of the invention, the program speed may be improved by reducing the distance between a circuit and a cell structure. In addition, by reducing an area of a pad region, integration density may be improved, and processes may be simplified.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
a first cell structure including first channel layers;
a second cell structure including second channel layers;
a pad structure located between the first cell structure and the second cell structure and including a first stepped structure and a second stepped structure, the first stepped structure including first pads electrically connected to the first and second cell structures and stacked on top of each other;
a circuit vertically arranged with the first cell structure, the second cell structure and the pad structure;
an interconnection electrically connecting the first pads to the circuit.

2. The semiconductor device of claim 1, further comprising an opening passing through the pad structure to expose the circuit.

3. The semiconductor device of claim 2, wherein the interconnection is electrically connected to the circuit through the opening.

4. The semiconductor device of claim 1, wherein the pad structure includes a dummy structure including wiring lines stacked on top of each other, the wiring lines electrically connecting the first cell structure and the second cell structure.

5. The semiconductor device of claim 1, wherein the pad structure includes a dummy structure including wiring lines stacked on top of each other, the wiring lines electrically connecting each of the first pads to the first and second cell structures in common.

6. A semiconductor device, comprising:
a first cell structure including first memory cells stacked on top of each other;

a second cell structure including second memory cells stacked on top of each other; and a pad structure located between the first cell structure and the second cell structure, wherein the pad structure comprises:

a stepped structure including pads stacked on top of each other; and a dummy structure including wiring lines stacked on top of each other, the wiring lines electrically connecting each of the pads to the first and second cell structures in common.

7. The semiconductor device of claim 6, further comprising a circuit vertically arranged with the pad structure, the first cell structure and the second cell structure.

8. The semiconductor device of claim 7, further comprising an interconnection electrically connecting the pads to the circuit.

9. The semiconductor device of claim 8, further comprising an opening passing through the pad structure to expose the circuit, wherein the interconnection is electrically connected to the circuit through the opening.

10. A semiconductor device, comprising:

a first cell structure including first to 4nth layers;

a pad structure electrically connected to the first cell structure; and a circuit located under the pad structure, wherein the pad structure comprises:

a first stepped structure including first pads stacked on top of each other;

a second stepped structure including second pads stacked on top of each other;

an opening passing through the pad structure to expose the circuit;

a first dummy stepped structure including first wiring lines stacked on top of each other, the first wiring lines electrically connecting the first pads to the first to 3nth layers of the first cell structure; and a second dummy stepped structure including second wiring lines stacked on top of each other, the second wiring lines electrically connecting the second pads to the first to 3nth layers of the first cell structure.

11. The semiconductor device of claim 10, further comprising a second cell structure facing the first cell structure with the pad structure interposed therebetween, the second cell structure including first to 4nth layers and being electrically connected to the pad structure.

12. The semiconductor device of claim 11, further comprising an interconnection structure electrically connecting the pads so that the circuit is electrically connected to the first and second cell structures in common.

13. The semiconductor device of claim 12, further comprising an opening passing through the pad structure to expose the circuit, wherein the interconnection structure is electrically connected to the circuit through the opening.

14. The semiconductor device of claim 10, wherein the circuit is vertically arranged with the pad structure, the first cell structure and the second cell structure.

* * * * *